United States Patent
Narasimhan et al.

(10) Patent No.: US 6,372,301 B1
(45) Date of Patent: Apr. 16, 2002

(54) METHOD OF IMPROVING ADHESION OF DIFFUSION LAYERS ON FLUORINATED SILICON DIOXIDE

(75) Inventors: Murali Narasimhan; Vikram Pavate, both of San Jose; Kenny King-Tai Ngan, Fremont; Xiangbing Li, San Jose, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/218,703

(22) Filed: Dec. 22, 1998

(51) Int. Cl.$^7$ .............................. C23C 14/02; H05H 1/00
(52) U.S. Cl. ....................... 427/534; 427/535; 427/250; 427/255.391; 427/255.394; 204/192.1
(58) Field of Search .................. 427/255.29, 255.31, 427/255.39, 534, 535, 574, 579, 250, 255.391, 255.394; 438/680, 710, 723; 204/192.1

(56) References Cited

U.S. PATENT DOCUMENTS

| | | | |
|---|---|---|---|
| 5,242,530 A | * 9/1993 | Batey et al. | 117/90 |
| 5,614,270 A | * 3/1997 | Yeh | 427/535 |
| 5,629,246 A | 5/1997 | Iyer | |
| 5,660,682 A | 8/1997 | Zhao et al. | |
| 5,661,093 A | 8/1997 | Ravi et al. | |
| 5,763,010 A | * 6/1998 | Guo et al. | 427/376.2 |
| 5,807,785 A | * 9/1998 | Ravi | 438/624 |
| 5,827,778 A | * 10/1998 | Yamada | 438/637 |
| 5,827,785 A | * 10/1998 | Bhan et al. | 438/784 |
| 5,874,367 A | * 2/1999 | Dobson | 438/787 |
| 5,876,798 A | * 3/1999 | Vassiliev | 427/255.7 |
| 5,994,778 A | * 11/1999 | Huang et al. | 257/758 |

FOREIGN PATENT DOCUMENTS

| | | | |
|---|---|---|---|
| JP | 09-275102 | 10/1997 | ........... H01L/21/31 |
| JP | 10-144793 | 5/1998 | ........... H01L/21/90 |

OTHER PUBLICATIONS

PCT International Search Report dated Mar. 3, 2000.

* cited by examiner

*Primary Examiner*—Bret Chen
(74) *Attorney, Agent, or Firm*—Moser, Patterson & Sheridan, LLP

(57) ABSTRACT

The present invention generally provides a method for stabilizing a halogen-doped silicon oxide film, particularly a fluorinated silicon oxide film. The invention also provides a method for preventing loosely bonded halogen atoms from reacting with components of the barrier layer during subsequent processing of the substrate. The invention provides a hydrogen plasma treatment of the halogen-doped silicon oxide film without subjecting the substrate to a heated environment that may damage the substrate and the structures formed on the substrate. The invention also improves the adhesion strength between the halogen-doped silicon oxide film and the barrier layer. Furthermore, the hydrogen plasma treatment can be practiced in a variety of plasma processing chambers of an integrated process sequence, including pre-clean chambers, physical vapor deposition chambers, chemical vapor deposition chambers, etch chambers and other plasma processing chambers.

27 Claims, 5 Drawing Sheets

METHOD OF IMPROVING ADHESION OF DIFFUSION LAYERS ON FLUORINATED SILICON DIOXIDE

BACKGROUND OF THE INVENTION

1. Field of tile Invention

The present invention generally relates to deposition of films onto a substrate. More particularly, the present invention relates to deposition of diffusion barriers and fluorinated silicon glass.

2. Background of the Related Art

As feature sizes have become smaller and multilevel metallization commonplace in, integrated circuits, low dielectric constant films have become increasingly important. Low dielectric constant films are particularly desirable for intermetal dielectric (IMD) layers to reduce the RC time delay of the interconnect metallization being covered to prevent crosstalk between the different levels of metallization, and to reduce device power consumption.

Many approaches to lower dielectric constants have been proposed. One of the more promising solutions is the incorporation of a halogen element, such as fluorine, chlorine or bromine into a silicon oxide layer. Fluorine, the preferred halogen dopant for silicon oxide, lowers the dielectric constant of the silicon oxide film because fluorine is an electronegative atom that decreases the solubility of the overall silicon oxide film. Fluorine-doped silicon oxide films are referred to as fluorosilicate glass films or FSG for short.

In addition to decreasing the dielectric constant, incorporating fluorine in silicon oxide layers also helps to solve common problems encountered in fabricating smaller geometry devices, such as filling closely spaced gaps between metal or polysilicon lines deposited over semiconductor structures. It is believed that because fluorine is an etching species, the introduction of fluorine during deposition of a silicon oxide film introduces an etching effect on the growing film. The simultaneous deposition/etching effect allows FSG films to have improved gap-filling capabilities such that the films are able to adequately cover adjacent metal layers having an aspect ratio of 1.8 or more. Thus, manufacturers desire to include fluorine in various dielectric layers and particularly in intermetal dielectric layers in multilevel structures.

Current integrated circuits generally include various formations of multilevel metal structures that form a high-conductivity, thin-film network fabricated above the silicon surface to connect various active devices through specific electrical paths. During the formation of metal-to-metal and metal-to-silicon contact structures in this thin-film network, openings are etched in the intermetal dielectric layer, such as the doped silicon dioxide film, that separates the substrate or underlying conductive thin film from the overlying conductive thin film. A conductive material, such as copper, aluminum or another metal, is then used to fill the opening and make a connection to the silicon substrate or underlying conductive thin film. Ideally, the impedance to current flow between the silicon and overlying connecting metal layer or between the underlying and overlying connecting metal layers should be as low as possible.

Diffusion barriers play a prominent role in the formation of multilevel metal structures which are present in many integrated circuits. Diffusion of materials between adjacent layers in semiconductor devices is a particular concern to those in the semiconductor industry. Such diffusion or intermixing may be prevented by sandwiching another material or stack of materials between the layers. The role of this third material or stack of materials is to prevent or retard the diffusion of the two materials into each other and hence the layer is often referred to as a diffusion barrier.

With the recent progress in sub-quarter-micron copper interconnect technology, tantalum and tantalum nitride have become popular barrier materials in addition to titanium and titanium nitride. Depending on the application, a diffusion barrier layer may comprise a tantalum layer, a tantalum nitride layer, a tantalum/tantalum nitride stack or other combinations of diffusion barrier materials. The diffusion barrier layer is commonly deposited over the doped silicon oxide film after openings for interconnect structures (contacts or vias) have been etched in the doped silicon oxide film. A metal, such as copper, is then deposited over the diffusion barrier to fill the interconnect feature.

During substrate processing, heat treatment steps in which a substrate is heated to a specified temperature for a specified time are employed for various reasons. For example, an anneal step may be used to repair damage to a substrate after a plasma processing step.

However, when a FSG film is subjected to a temperature greater than about 350° C., loosely-bonded (dangling bonds) fluorine atoms and residual fluorine atoms tend to be released from the FSG film. The released fluorine atoms from the FSG film react with the tantalum component of the tantalum nitride barrier layer and form volatile $TaF_2$. $TaF_2$ formation increases the resistance of the interconnect structure and causes significant losses in the adhesion properties between the tantalum nitride layer and the FSG film. The loss in adhesion properties causes the tantalum nitride barrier layer to peel off during subsequent processing of the substrate, resulting in the formation of defects. Similarly, for a titanium based barrier layer, the released fluorine atoms react with the titanium to form TiF, which leads to defect formations on the substrate as $TiF_2$.

From the discussion above, it can be seen that low dielectric constant films, such as FSG and other halogen-doped silicon oxides, are desirable to use as intermetal dielectric layers in multilevel metal structures. However, there is a need to prevent reactions between the halogen-doped silicon oxides and the adjacent diffusion barrier material.

U.S. Pat. No. 5,763,010, by Guo et al, hereby incorporated by reference, illustrates an attempt to stabilize a halogen-doped silicon oxide film and to reduce halogen atoms migration and reaction with adjacent films during subsequent processing. The deposited halogen-doped silicon oxide film is subjected to a degassing step in which the film is briefly heated to a temperature of between about 300° C. and about 500° C. for between about 35 seconds and about 50 seconds before deposition of the barrier layer. The heat degassing treatment removes loosely bonded halogen atoms. However, the heat degassing treatment may produce more loosely bonded halogen atoms in the halogen-doped silicon oxide film when the substrate has been heated for a longer period of time than the optimal heat degassing treatment time. Furthermore, when the substrate has been heated for a shorter period of time than the optimal heat degassing treatment time, the heat degassing treatment may remove an insufficient amount of loosely bonded halogen atoms in the halogen-doped silicon oxide film. Also, it is generally preferred to minimize the substrate's exposure to a heated environment.

Therefore, there remains a need for a method to stabilize a halogen-doped silicon oxide film and to prevent loosely bonded halogen atoms from reacting with components of the barrier layer during subsequent processing of the substrate without subjecting the substrate to a heated environment. It would be desirable for the method to improve the adhesion strength between the halogen-doped silicon oxide film and the barrier layer. It would be further desirable for the method to be practiced in an integrated process sequence with other substrate processing such that the method can be practiced in a variety of processing chambers, including both physical vapor deposition chambers as well as chemical vapor deposition chambers.

SUMMARY OF THE INVENTION

The present invention generally provides a method for stabilizing a halogen-doped silicon oxide film and preventing loosely bonded halogen atoms from reacting with components of the barrier layer during subsequent processing of the substrate. The invention provides a hydrogen plasma treatment of the halogen-doped silicon oxide film without subjecting the substrate to a heated environment that may damage the substrate and the structures formed on the substrate. The invention also improves the adhesion strength between the halogen-doped silicon oxide film and the barrier layer. Furthermore, the hydrogen plasma treatment can be practiced in a variety of processing chambers of an integrated process sequence, including pre-clean chambers, physical vapor deposition chambers, chemical vapor deposition chambers, etch chambers and other plasma processing, chambers.

In one aspect, the invention provides a method for treating a halogen-doped silicon oxide film, particularly a fluorinated silicon oxide film, deposited on a substrate, comprising exposing the halogen-doped silicon oxide film to a hydrogen plasma. Preferably, the hydrogen plasma treatment is carried out in a pre-clean chamber, and the substrate is transferred without breaking vacuum to another chamber used for depositing the diffusion barrier film. A diffusion barrier film, such as tantalum nitride, is then deposited over the treated halogen-doped silicon oxide film. The hydrogen plasma reactive cleaning process removes the loosely bonded halogen atoms from the silicon oxide film and provides a stable structure for the remaining halogen-doped silicon oxide film. The resulting film does not react with the barrier material and retains its adhesive properties with the barrier film.

Another aspect of the present invention provides a method for treating a fluorinated silicon oxide film deposited on a substrate, comprising reactive cleaning the fluorinated silicon oxide film using a hydrogen plasma. Preferably, the hydrogen plasma comprises a plasma of a processing gas comprising hydrogen and a carrier gas, wherein the processing gas contains between about 5% and about 50% hydrogen. The fluorinated silicon oxide film is subjected to the hydrogen plasma treatment for between about 10 seconds and about 300 seconds to remove the loosely bonded fluorine atoms in the fluorinated silicon oxide film and to stabilize the fluorinated silicon oxide film. The hydrogen plasma treatment improves adhesion of a subsequently deposited barrier film, such as a tantalum nitride film, because there are no loosely bonded fluorine atoms to be released during subsequent high temperature processes to form a refractory fluoride compound between the films.

BRIEF DESCRIPTION OF THE DRAWINGS

So that the manner in which the above recited features, advantages and objects of the present invention are attained can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
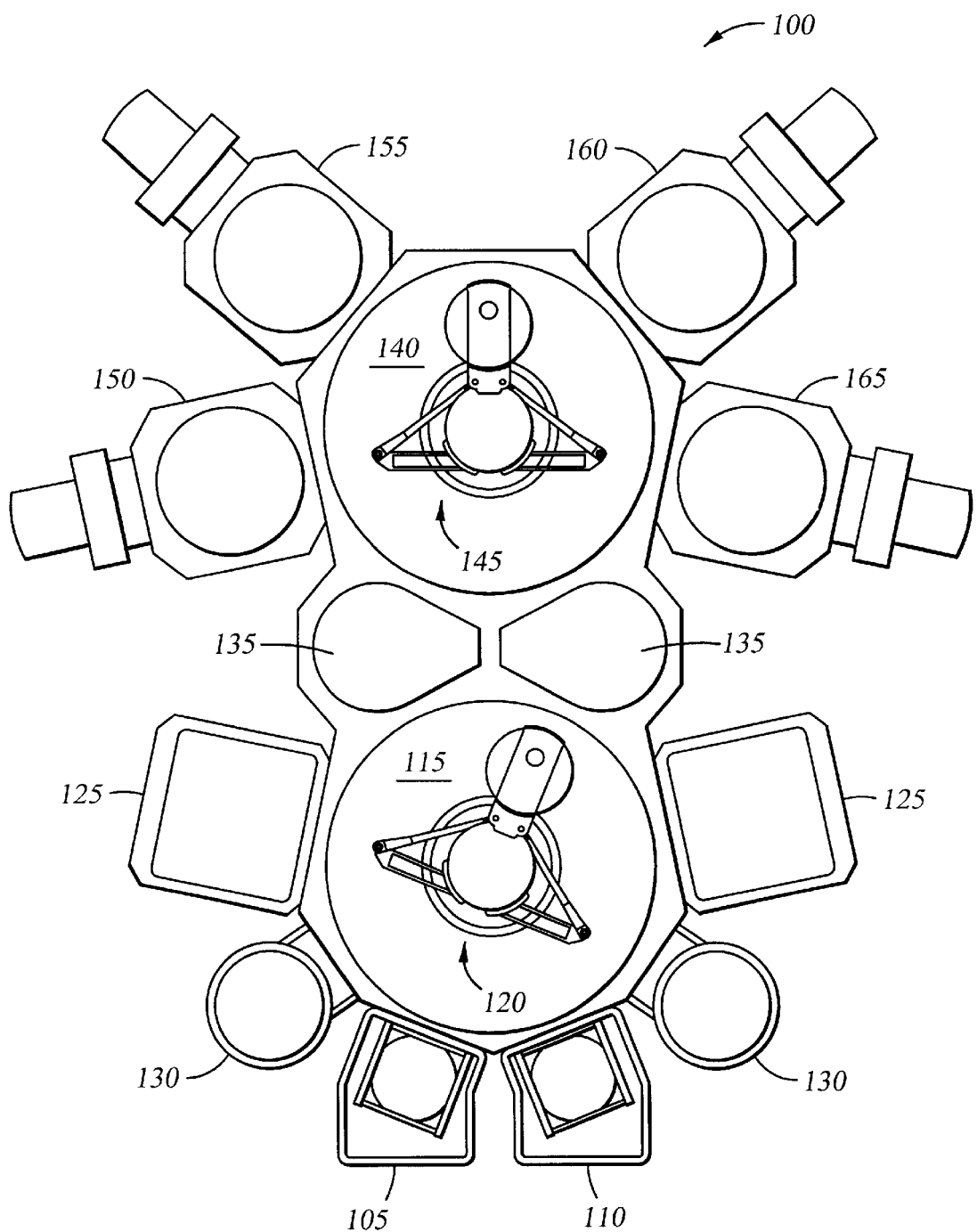
FIG. 1 is a schematic view of a cluster tool system having multiple substrate processing chambers.

FIG. 1 is a schematic view of a cluster tool system having multiple substrate processing chambers. The cluster tool system 100 includes vacuum load-lock chambers 105 and 110 attached to a first stage transfer chamber 115. The load-lock chambers 105 and 110 maintain vacuum conditions within the first stage transfer chamber 115 while substrates enter and exit system 100. A first robot 120 transfers substrates between the load-lock chambers 105 and 110 and one or more substrate processing chambers 125 and 130 attached to the first stage transfer chamber 115. Processing chambers 125 and 130 can be outfitted to perform a number of substrate processing operations such as chemical vapor deposition (CVD), physical vapor deposition (PVD), etch, pre-clean, degas, orientation and other substrate processes. The first robot 120 also transfers substrates to/from one or more transfer chambers 135 disposed between the first stage transfer chamber 115 and a second stage transfer chamber 140.

The transfer chambers 135 are used to maintain ultrahigh vacuum conditions in the second stage transfer chamber 140 while allowing substrates to be transferred between the first stage transfer chamber 115 and the second stage transfer chamber 140. A second robot 145 transfers substrates between the transfer chambers 135 and a plurality of substrate processing chambers 150, 155, 160 and 165. Similar to processing chambers 125 and 130, the processing chambers 150 to 165 can be outfitted to perform a variety of substrate processing operations. For example, the processing chamber 150 is a CVD chamber outfitted to deposit a halogen-doped silicon oxide film; the processing chamber 155 is an etching chamber outfitted to etch apertures or opening for interconnect features; the processing chamber 160 is a PVD chamber outfitted to reactively sputter deposit a tantalum nitride film; and the processing chamber 165 is a PVD chamber outfitted to sputter deposit a copper film. The above listed sequence arrangement of the processing chambers is useful for practicing the present invention. A plurality of cluster tool systems may be required to perform all of the processes required to complete manufacturing of an integrated circuit or chip.

During operation, substrates are brought to vacuum load-lock chambers 105 and 110 by a conveyor belt or robot system (not shown) that operates under the control of a computer program executed by a microprocessor or computer (not shown). Also, the robots 120 and 145 operate under control of the computer program to transfer substrates between the various processing chambers of the cluster tool system 100.

The above-described cluster tool system is mainly for illustrative purposes. Other plasma processing equipment, such as electron cyclotron resonance (ECR) plasma processing devices, induction-coupled RF high-density plasma processing devices or the like may be employed as part of the cluster tool system. Additionally, the method for forming a halogendoped silicon oxide layer and barrier layer of the present invention is not limited to any specific apparatus or to any specific plasma excitation method.

Figure 2:
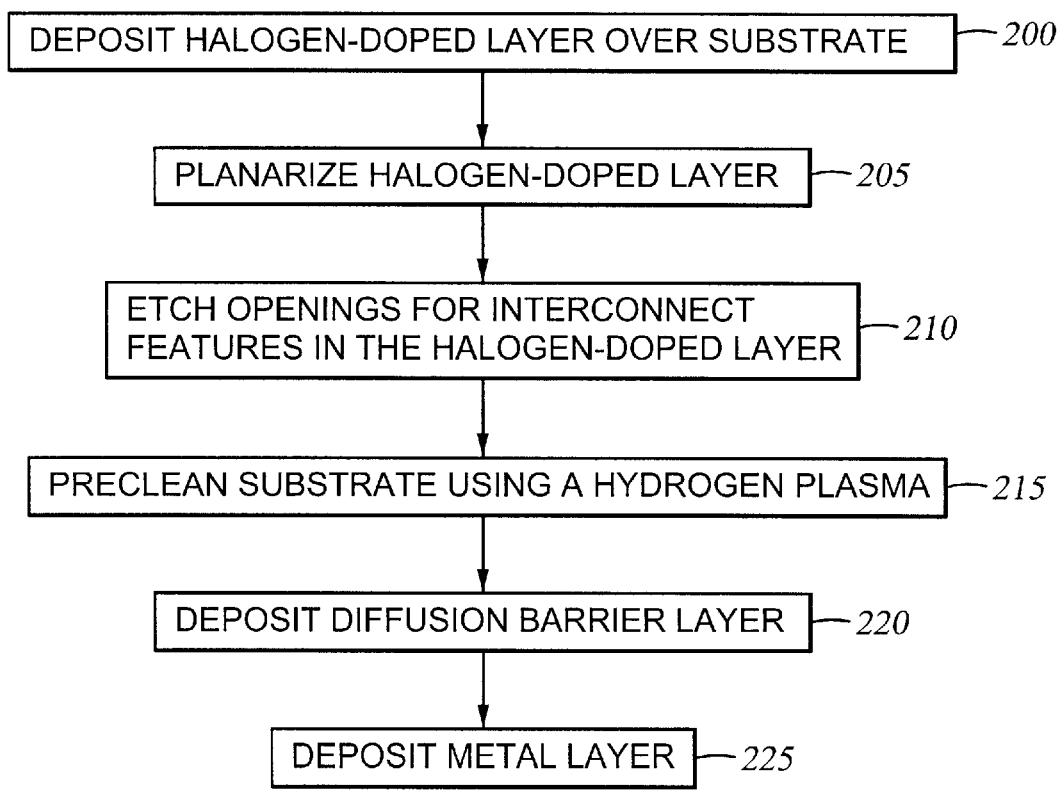
FIG. 2 is a flowchart showing the hydrogen plasma pre-cleaning step of the present invention along with other process sequence steps that occur before and after the hydrogen plasma pre-cleaning step.

FIG. 2 is a flowchart showing the hydrogen plasma pre-cleaning step of the present invention along with other process sequence steps that occur before and after the hydrogen plasma pre-cleaning step. The steps shown in FIG. 2 can be executed in response to instructions of a computer program executed by a microprocessor or computer controller for the cluster tool system 100.

First, a FSG layer or similar halogen-doped silicon oxide layer is deposited over a substrate (step 200). The deposition of halogen-doped silicon oxide films can be accomplished through a variety of methods well known in the art. Preferably, the FSG layer is deposited using a chemical vapor deposition process performed, for example, in the CVD chamber 150 as shown in FIG. 1. Before deposition of the halogen-doped layer, however, the substrate is typically subjected to multiple processing steps to form active devices and other structures as understood by a person of ordinary skill in the art.

Second, the halogen-doped silicon oxide layer is planarized (step 205) in preparation for deposition of overlying layers. The planarization process can include chemical mechanical polishing (CMP), etching or other similar processes. Once the halogen-doped silicon oxide layer is planarized, openings or apertures for interconnect features, such as contacts and vias, are etched in the halogen-doped silicon oxide layer (step 210). The etching process can be carried out in a typical etch chamber, such as the etch chamber 155 as shown in the cluster tool system 100 of FIG. 1. Typically, the planarized halogen-doped silicon oxide layer is between about 0.5 microns and about 3.0 microns thick, and the interconnect features have sub-quarter micron openings and aspect ratios (ratio of width to height) greater than 1:1. Steps 205 and 210 produces a patterned substrate having interconnect features to be metallized or filled with layers of materials.

Third, the hydrogen plasma pre-cleaning step according to the present invention is performed on the patterned substrate. The substrate is pre-cleaned using a hydrogen plasma (step 215) to remove loosely bonded halogen atoms and to stabilize the structure of the halogen-doped silicon oxide layer. In the pre-cleaning step, the hydrogen atoms in the hydrogen plasma react with the loosely bonded fluorine atoms to form hydrogen fluoride (HF), which is exhausted from the processing chamber. Because the loosely bonded halogen atoms are removed by the pre-cleaning process, the remaining structure of the halogen-doped silicon oxide layer becomes a stable film. Although the pre-cleaning step can be carried out in any typical plasma processing chamber, the pre-cleaning step is preferably carried out in a pre-clean chamber. The hydrogen plasma pre-cleaning step according to the invention is discussed in more detail infra with reference to a pre-clean chamber shown in FIG. 3.

Next, a diffusion barrier layer, preferably tantalum nitride, is deposited (step 220) to prevent diffusion of silicon into an overlaying metal layer. The diffusion barrier layer also improves film adhesion between different films, such as a metal film and a silicon oxide film. The tantalum nitride layer is preferably deposited using a PVD chamber outfitted for reactive sputtering which is well known in the art. Preferably, the diffusion barrier layer has a film thickness between about 50 Å and about 200 Å.

Figure 3:
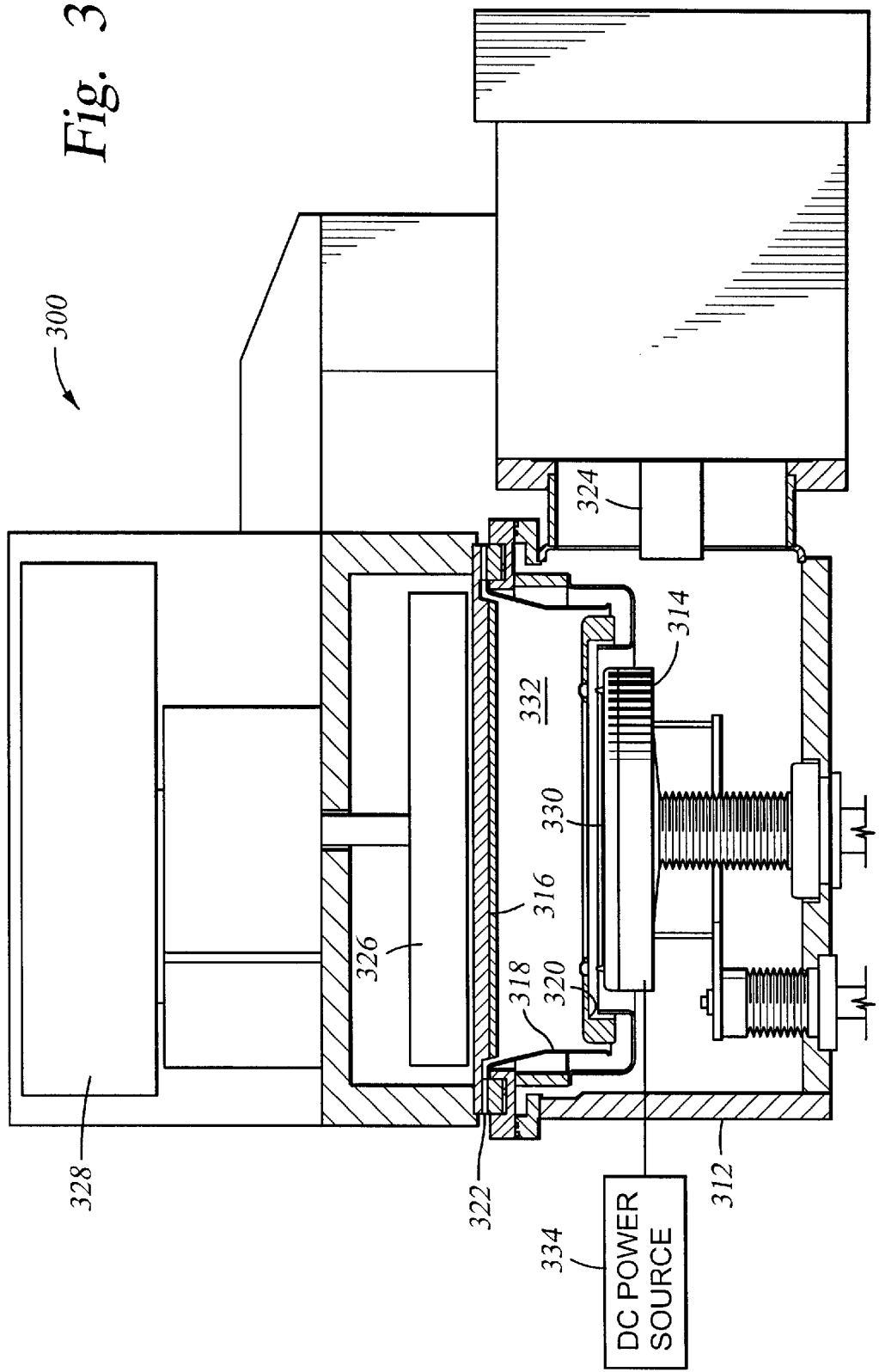
FIG. 3 is a cross sectional view of a typical PVD chamber useful for depositing a barrier layer.

FIG. 3 is a cross sectional view of a typical PVD chamber useful for depositing a barrier layer. The PVD chamber 310 generally includes a chamber enclosure 312, a substrate support member 314, a target 316, a shield 318, a clamp ring 320, a gas inlet 322, a gas exhaust 324, a magnet assembly 326, an RF power source 328 and a DC power source. During processing, a substrate 330 is placed on the substrate support member 314 and a processing gas is introduced through the gas inlet 322 disposed between the edge of the target and the top portion of the shield into a processing region 332 defined by the target 316, the substrate 330 and the shield 318. The RF power source 328 supplies an RF power to the target to strike and maintain a plasma of the processing gas in the processing region 332 during processing while the DC power source 334 supplies a DC bias to the substrate support member 314. The shield 318 is typically grounded during processing. During deposition, the ions in the plasma bombard the target to sputter material from the target surface. The sputtered material react with ions in the plasma and form the desired film on the surface of the substrate. For deposition of a barrier film, such as tantalum nitride, the processing gas typically comprises argon and nitrogen, wherein argon serves as the primary gas source for the plasma ions that bombard the target 316 and nitrogen primarily reacts with the sputtered atoms (tantalum) from the target 316 to form a tantalum nitride film which is deposited onto the substrate 330. After deposition of the barrier film, the substrate is typically annealed at a temperature between about 300° C. and about 500° C. to improve the material properties of the deposited film.

Lastly, a metal layer, such as copper, is deposited over the diffusion barrier layer to complete the formation of the interconnect feature (step 225). Preferably, the metal layer is between about 6,000 Å and about 10,000 Å thick. The copper deposition can be carried out in a typical PVD chamber or a typical CVD chamber which are well known in the art. The above-described process may be repeated for multi-level integrated circuit structures.

According to the present invention, the FSG film is pre-cleaned using a hydrogen plasma prior to the deposition of the tantalum nitride barrier layer. The pre-cleaning process can be carried out in a variety of processing chamber, including a PVD chamber, a CVD chamber, an etch chamber and a pre-clean chamber. Preferably, the pre-cleaning process is carried out using a pre-clean chamber prior to the deposition of the tantalum nitride barrier layer. Although the invention is described using a pre-clean chamber, it is understood that the invention is applicable to a variety of processing chambers. For example, the pre-cleaning process can be carried out in the same PVD chamber outfitted for deposition of the barrier layer to decreased the time spent transferring substrates between the pre-clean chamber and the PVD chamber.

Figure 5:
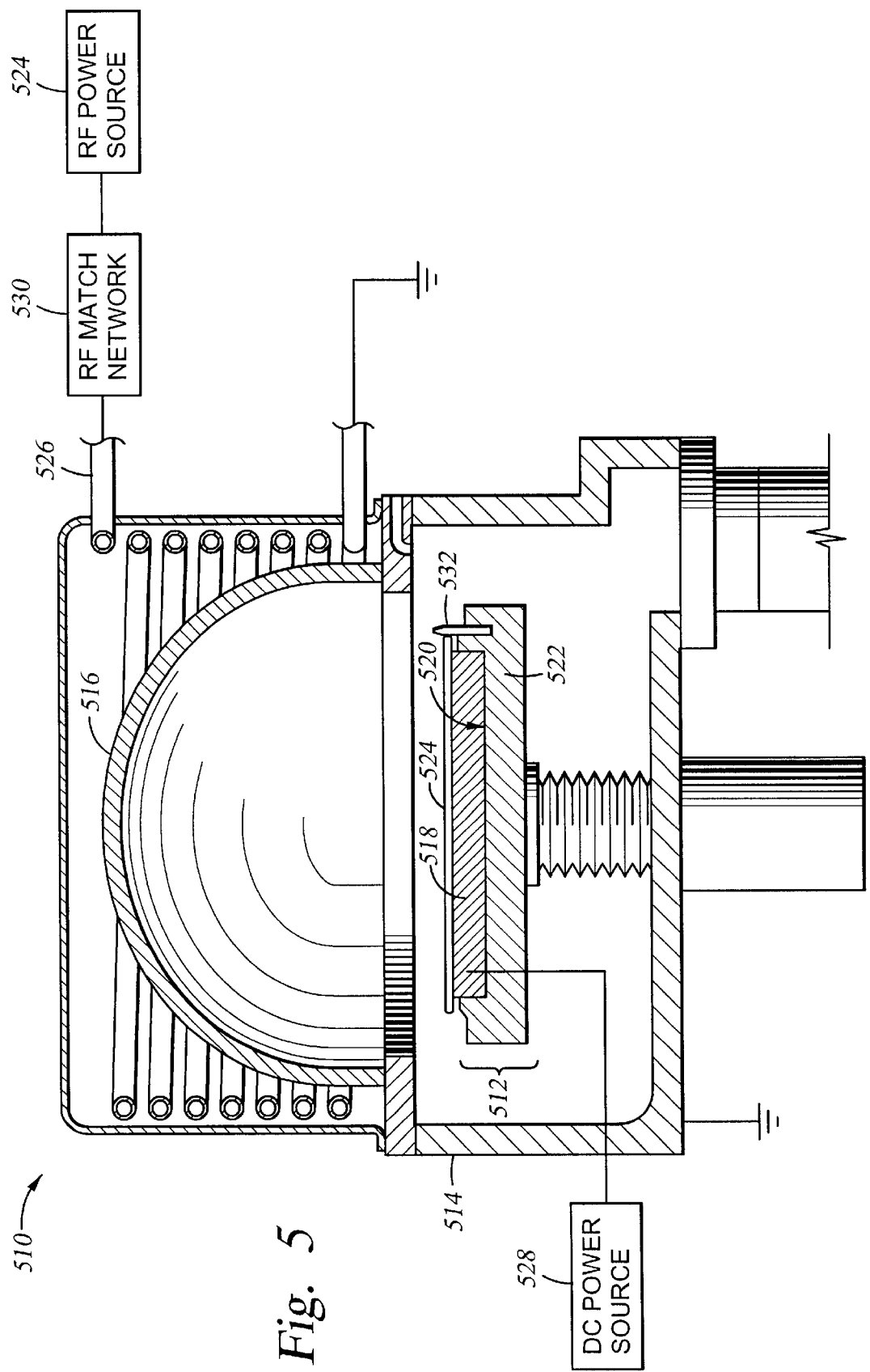
FIG. 5 is a cross sectional view of a typical pre-clean chamber useful for the present invention.

FIG. 5 is a cross sectional view of a typical pre-clean chamber useful for the present invention. An example of a pre-clean chamber useful for the present invention is the Pre-Clean II Chamber available from Applied Materials, Inc., Santa Clara, Calif. Generally, the pre-clean chamber 510 has a substrate support member 512 disposed in a chamber enclosure 514 under a quartz dome 516. The substrate support member 512 typically includes a central pedestal plate 518 disposed within a recess 520 on a quartz insulator plate 522. During processing, the substrate 524 is placed on the central pedestal plate 518 and contained thereon by locating pin 532. Preferably, an RF coil 526 is disposed outside of the quartz dome 516 and connected to an RF power source 524 to strike and maintain a plasma of the process gases within the chamber. Generally, a RF match network 530 is provided to match the RF power source 524 and the RF coil 526. Typically, the substrate support member 512 is connected to a DC power source 528 that provides a bias to the substrate support member 512.

According to the invention, the patterned or etched substrate is preferably pre-cleaned using a hydrogen plasma in the pre-clean chamber prior to the deposition of a barrier layer. Preferably, the substrate is transferred into the pre-clean chamber after the FSG film has been planarized and the openings of the interconnect features have been formed. The etching of the substrate may be processed in another processing platform or system before the substrate is transferred to a processing platform or system having a pre-clean chamber. Once the substrate is positioned for processing in the pre-clean chamber, a processing gas comprising between about 0% and about 100% hydrogen is introduced into the processing region. Preferably, the processing gas comprises between about 5% and about 50% hydrogen, with a carrier gas, such as argon or helium, for the remainder of the percentage. A plasma of the processing gas is struck in the processing region to subject the substrate in a hydrogen plasma environment. Preferably, the hydrogen plasma is generated by applying between about 50 W and about 500 W of plasma coil power from the RF power source 524 to the RF coil 526 and between about 10 W and about 300 W of DC bias power from the DC power source 528 to the substrate support member 512. The hydrogen plasma is preferably maintained for between about 10 seconds and about 300 seconds to provide sufficient cleaning time for the loosely bonded fluorine to react with the hydrogen to form hydrogen fluoride (HF). Once the pre-cleaning process is completed, the pre-clean chamber is evacuated to exhaust the processing gas and the reacted byproducts from the pre-cleaning process. The barrier layer is then deposited over the cleaned substrate, and the remaining processes outlined in FIG. 2 is then carried out. Because the loosely bonded halogen atoms are removed from halogendoped silicon oxide layer by the pre-cleaning process, no loosely bonded halogen atoms are released by the annealing process, and the reaction between the tantalum nitride barrier layer and the halogen-doped silicon oxide layer is prevented during the annealing process.

Figure 4:
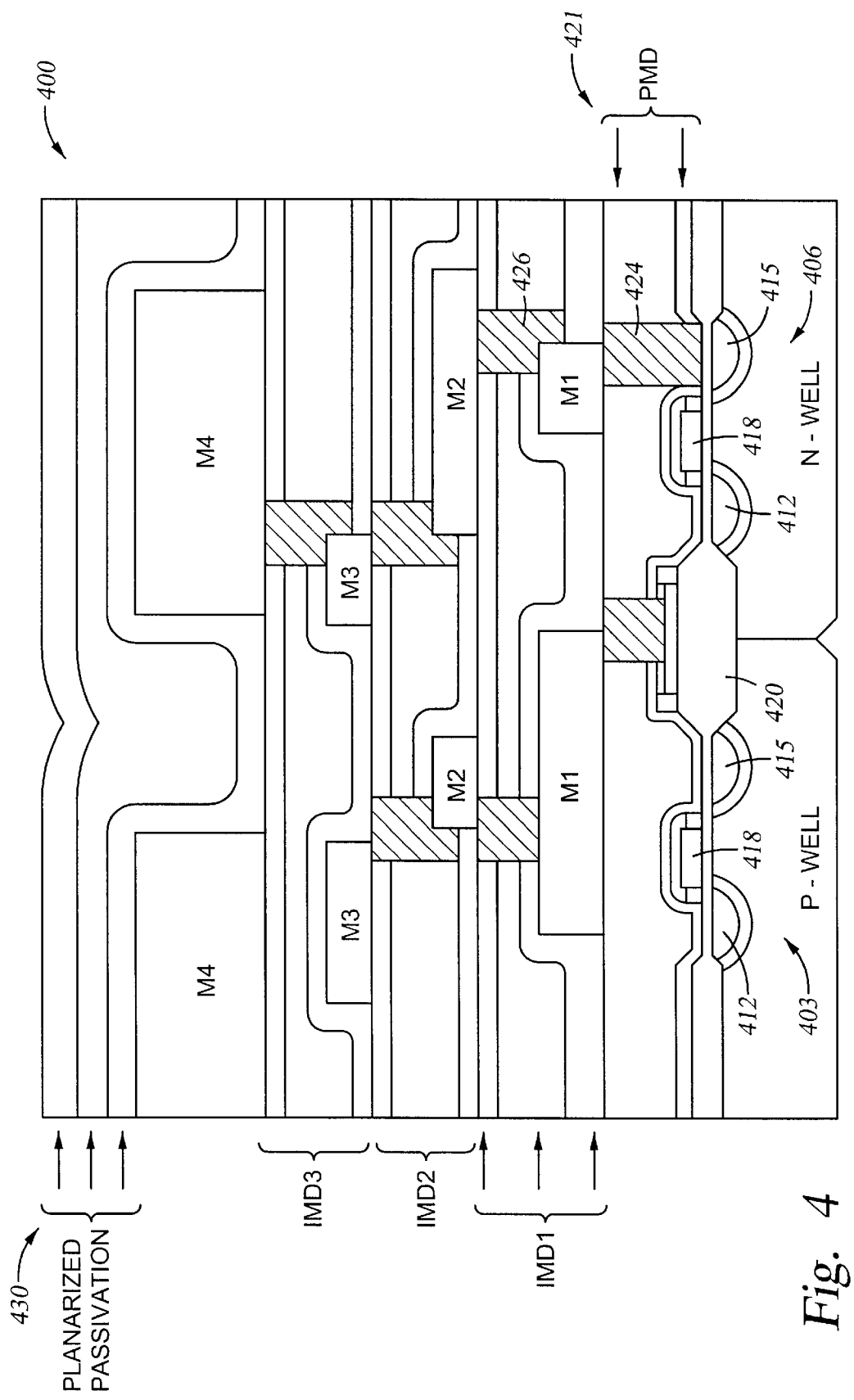
FIG. 4 provides an exemplary structure that benefits from the present invention.

FIG. 4 provides an exemplary structure that benefits from the present invention. FIG. 4 illustrates a simplified cross-sectional view of a CMOS integrated circuit 400. As shown, the CMOS integrated circuit 400 includes NMOS and PMOS transistors 403 and 406. Which are separated and electrically isolated from each other by a field oxide region 420. Each transistor 403 and 406 comprises a source region 412, a drain region 415 and a gate region 418. A premetal dielectric layer 421 separates transistors 403 and 406 from metal layer M1 with connections between metal layer M1 and the transistors made by contacts 424. Metal layer M1 is one of four metal layers, M1–M4, included in integrated circuit 400. Each metal layer M1–M4 is separated from adjacent metal layers by respective intermetal dielectric layers IMD1, IMD2 or IMD3. Adjacent metal layers are connected at selected openings by vias 426. Deposited over metal layer M4 are planarized passivation layers 430.

While the present invention may find uses to treat and stabilize each of the dielectric layers shown in integrated circuit 400, it is particularly useful in treating halogen-doped IMD layers. Physical properties of such halogen-doped layers, such as their low dielectric constant and good gap-fill properties, make such halogen-doped films most useful as an insulation layer between adjacent metal layers as shown by EMD layers IMD–MD3. Typically, such IMD layers are between about 0.5 and 3.0 microns thick.

The present invention may also be used in treating halogen-doped damascene layers which are included in some integrated circuits. In damascene layers, a blanket FSG layer is deposited over a substrate, selectively etched through and then filled with metal and etched back or polished to form metal layers such as layer M1. After the metal layer is deposited, second blanket FSG deposition is performed and selectively etched. The etched areas are then filled with metal and etched back or polished to form vias 426.

It should be understood that the simplified integrated circuit 400 is for illustrative purposes only. One of ordinary skill in the art could implement the present method for. fabrication of other integrated circuits such as microprocessors, application-specific integrated circuits (ASICS), memory devices, and the like. Additionally, the method of the present invention may be used in the fabrication of integrated circuits using technologies such as BICMOS, NMOS, bipolar and others.

While the foregoing is directed to the preferred embodiment of the present invention, other and further embodiments of the invention may be devised without departing from the basic scope thereof. The scope of the invention is determined by the claims which follow.

What is claimed is:

1. A method for improving adhesion of a film deposited over a halogen-doped silicon oxide film, comprising:
   a) exposing the halogen-doped silicon oxide film to a hydrogen plasma; and
   b) depositing the film thereover.

2. The method of claim 1 wherein exposing the halogen-doped silicon oxide film to a hydrogen plasma is carried out in a pre-clean chamber.

3. The method of claim 1 wherein the hydrogen plasma comprise s a plasma of a processing gas comprising hydrogen and a carrier gas.

4. The method of claim 1 wherein the hydrogen plasma comprises a plasma of a processing gas comprising between about 5% and about 50% hydrogen.

5. The method of claim 1 wherein the halogen-doped silicon oxide film is exposed to the hydrogen plasma for between about 10 seconds and about 300 seconds.

6. The method of claim 1 wherein the hydrogen plasma is generated by applying between about 50 W and about 500 W of power from a RF power source to a RF coil and between about 10 W and about 300 W of power from a DC power source to a substrate support member.

7. The method of claim 1 wherein the film is selected from the group consisting of titanium, titanium nitride, tantalum, tantalum nitride, or a combination thereof.

8. A method for forming a barrier film over a halogen-doped silicon oxide film on a substrate, comprising:
   a) exposing the halogen-doped silicon oxide film to a hydrogen plasma; and
   b) depositing the barrier film over the halogen-doped silicon oxide film.

9. The method of claim 8 wherein exposing the halogen-doped silicon oxide film to a hydrogen plasma is carried out in a pre-clean chamber.

10. The method of claim 9 wherein depositing the barrier film is carried out in a physical vapor deposition chamber.

11. The method of claim 10 wherein the hydrogen plasma comprises a plasma of a processing gas comprising hydrogen and a carrier gas.

12. The method of claim 11 wherein the processing gas comprises between about 0% and about 100% hydrogen.

13. The method of claim 11 wherein the processing gas comprises between about 5% and about 50% hydrogen.

14. The method of claim 13 wherein the hydrogen plasma is generated by applying between about 50 W and about 500 W of power from a RF power source to a RF coil and between about 10 W and about 300 W of power from a DC power source to a substrate support member.

15. The method of claim 14 wherein the halogen-doped silicon oxide film is exposed to the hydrogen plasma for between about 10 seconds and about 300 seconds.

16. The method of claim 11 wherein the hydrogen plasma is generated by applying between about 50 W and about 500 W of power from a RF power source to a RF coil and between about 10 W and about 300 W of power from a DC power source to a substrate support member.

17. The method of claim 10 wherein the barrier film is deposited using reactive sputtering.

18. The method of claim 10 where the barrier film is selected from the group consisting of titanium, titanium nitride, tantalum, tantalum nitride, or a combination thereof.

19. The method of claim 8 wherein the halogen-doped silicon oxide film is exposed to the hydrogen plasma for between about 10 seconds and about 300 seconds.

20. A method for treating a fluorinated silicon oxide film deposited on a substrate, comprising:
   a) positioning the substrate in a plasma processing chamber; and
   b) exposing the fluorinated silicon oxide film to a hydrogen plasma.

21. The method of claim 20 wherein the hydrogen plasma comprises a plasma of a processing gas comprising hydrogen and a carrier gas.

22. The method of claim 21 wherein the processing gas comprises between more than 0% to about 100% hydrogen.

23. The method of claim 21 wherein the processing gas comprises between about 5% to about 50% hydrogen.

24. The method of claim 21 wherein the hydrogen plasma is generated by applying between about 50 W and about 500 W of power from a RF power source to a RF coil and between about 10 W and about 300 W of power from a DC power source to a substrate support member.

25. The method of claim 20, further comprising:
   c) depositing a barrier film over the fluorinated silicon oxide film.

26. The method of claim 25 wherein the barrier film comprises tantalum nitride.

27. The method of claim 20 wherein the fluorinated silicon oxide film is exposed to the hydrogen plasma for between about 10 seconds and about 300 seconds.

* * * * *

UNITED STATES PATENT AND TRADEMARK OFFICE
CERTIFICATE OF CORRECTION

PATENT NO.     : 6,372,301 B1                                              Page 1 of 1
DATED          : April 16, 2002
INVENTOR(S)    : Narasimhan et al.

It is certified that error appears in the above-identified patent and that said Letters Patent is hereby corrected as shown below:

<u>Column 1,</u>
Line 7, please change "tile" to -- the --.

<u>Column 5,</u>
Line 13, please change "halogendoped" to -- halogen-doped --.

<u>Column 8,</u>
Line 9, please change "EMD" to -- IMD --.

Signed and Sealed this

Fifth Day of August, 2003

JAMES E. ROGAN
*Director of the United States Patent and Trademark Office*